(12) United States Patent
Park et al.

(10) Patent No.: US 6,982,524 B2
(45) Date of Patent: Jan. 3, 2006

(54) DUAL PANEL-TYPE ORGANIC ELECTROLUMINESCENT DISPLAY DEVICE AND METHOD OF FABRICATING THE SAME

(75) Inventors: Jae-Yong Park, Gyeonggi-do (KR); So-Haeng Cho, Gyeonggi-do (KR)

(73) Assignee: LG.Philips LCD Co., Ltd., (KR)

( * ) Notice: Subject to any disclaimer, the term of this patent is extended or adjusted under 35 U.S.C. 154(b) by 224 days.

(21) Appl. No.: 10/695,947

(22) Filed: Oct. 30, 2003

(65) Prior Publication Data

US 2004/0090173 A1    May 13, 2004

(30) Foreign Application Priority Data

Nov. 13, 2002    (KR) .................. 10-2002-0070299

(51) Int. Cl.
*H05B 33/06*    (2006.01)
(52) U.S. Cl. .................. 313/506; 313/504; 313/505; 313/512; 257/81
(58) Field of Classification Search ......... 313/498–512
See application file for complete search history.

(56) References Cited

U.S. PATENT DOCUMENTS

| | | | |
|---|---|---|---|
| 6,046,547 A * | 4/2000 | Nishio et al. ............ 315/169.3 |
| 6,175,345 B1 * | 1/2001 | Kuribayashi et al. ......... 345/76 |
| 6,429,599 B1 * | 8/2002 | Yokoyama ............... 315/169.3 |
| 6,744,197 B2 * | 6/2004 | Park et al. ................... 313/504 |
| 6,777,870 B2 * | 8/2004 | Sundahl ...................... 313/504 |
| 6,911,670 B2 * | 6/2005 | Kim et al. .................... 257/72 |
| 2003/0127972 A1 * | 7/2003 | Han et al. .................... 313/504 |
| 2004/0207315 A1 * | 10/2004 | Robbie et al. .............. 313/504 |

FOREIGN PATENT DOCUMENTS

JP    10-333601    12/1998

* cited by examiner

*Primary Examiner*—Karabi Guharay
*Assistant Examiner*—German Colon
(74) *Attorney, Agent, or Firm*—Morgan Lewis & Bockius LLP

(57) ABSTRACT

An organic electroluminescent display device includes first and second substrates bonded together, the first and second substrates having a plurality of pixel regions, each pixel region includes a central portion and first and second portions at both sides of the central portion, a driving element on an inner surface of the first substrate within each of the plurality of pixel regions, the driving element being disposed in the central portion, first and second connection electrodes contacting the driving element and disposed in the first and second portions, a first electrode on an inner surface of the second substrate, an organic electroluminescent layer on the first electrode, and a second electrode on the organic electroluminescent layer, the second electrode contacting the first and second connection electrodes.

21 Claims, 10 Drawing Sheets

US 6,982,524 B2

DUAL PANEL-TYPE ORGANIC ELECTROLUMINESCENT DISPLAY DEVICE AND METHOD OF FABRICATING THE SAME

The present invention claims the benefit of Korean Patent Application No. 2002-70299 filed in Korea on Nov. 13, 2002, which is hereby incorporated by reference.

BACKGROUND OF THE INVENTION

1. Field of the Invention

The present invention relates to an organic electroluminescent display device and a method of fabricating an organic electroluminescent display device, and more particularly, to a dual panel-type organic electroluminescent display device and a method of fabricating a dual panel-type organic electroluminescent display device.

2. Discussion of the Related Art

In general, organic electroluminescent display (OELD) devices have an electron-input electrode, which is commonly referred to as a cathode, and hole-input electrode, which is commonly referred to as an anode. The electrons and the holes are supplied to an electroluminescent layer from the cathode and anode, respectively, wherein the electron and hole together form an exciton. The OELD device emits light when the exciton is reduced from an excited state level to a ground state level. Accordingly, since the OELD devices do not require additional light sources, both volume and weight of the OELD devices may be reduced. In addition, the OELD devices are advantageous because of their low power consumption, high luminance, fast response time, and low weight. Presently, the OELD devices are commonly implemented in mobile telecommunication terminals, car navigation systems (CNSs), personal digital assistants (PDAs), camcorders, and palm computers. In addition, since manufacturing processes for the OELD devices are simple, manufacturing costs can be reduced as compared to liquid crystal display (LCD) devices.

The OELD devices may be classified into passive matrix-type and active matrix-type. Although the passive matrix-type OELD devices have simple structures and simplified manufacturing processes, they require high power consumption and are not suitable for large-sized display devices. In addition, aperture ratios decrease as the number of electro lines increase. On the other hand, the active matrix-type OELD devices have high light-emitting efficiency and high image display quality.

FIG. 1 is a cross sectional view of an OELD device according to the related art. In FIG. 1, the OELD device 10 has a transparent first substrate 12, a thin film transistor array part 14, a first electrode 16, an organic electroluminescent layer 18, and a second electrode 20, wherein the thin film transistor array part 14 is formed on the transparent first substrate 12. The first electrode 16, organic electroluminescent layer 18, and second electrode 20 are formed over the thin film transistor array part 14. The electroluminescent layer 18 emits red (R), green (G), and blue (B) colored light, and it is commonly formed by patterning organic material separately in each pixel region "P" for the R, G, and B colored light. A second substrate 28 has a moisture absorbent desiccant 22. The OELD device 10 is completed by bonding the first and second substrates 12 and 28 together by disposing a sealant 26 between the first and second substrates 12 and 28. The moisture absorbent desiccant 22 removes moisture and oxygen that may be infiltrated into an interior of the organic ELD 10. The moisture absorbent desiccant 22 is formed by etching away a portion of the second substrate 28, filling the etched portion of the second substrate 28 with moisture absorbent desiccant material, and fixing the moisture absorbent desiccant material with a tape 25.

FIG. 2 is a plan view of a thin film transistor array part of an OELD device according to the related art. In FIG. 2, each of a plurality of pixel regions "P" defined on a substrate 12 includes a switching element "$T_S$," a driving element "$T_D$," and a storage capacitor "$C_{ST}$." The switching element "$T_S$" and the driving element "$T_D$" may be formed with combinations of more than two thin film transistors (TFTs), and the substrate 12 is formed of a transparent material, such as glass and plastic. A gate line 32 is formed along a first direction, and a data line 34 is formed along a second direction perpendicular to the first direction, wherein the data line 34 crosses the gate line perpendicularly with an insulating layer between the gate and data lines 32 and 34. In addition, a power line 35 is formed along the second direction, and is spaced apart from the data line 34.

The TFT used for the switching element "$T_S$" has a switching gate electrode 36, a switching active layer 40, a switching source electrode 46, and a switching drain electrode 50. The TFT for the driving element "$T_D$" has a driving gate electrode 38, a driving active layer 42, a driving source electrode 48, and a driving drain electrode 52. The switching gate electrode 36 is electrically connected to the gate line 32, and the switching source electrode 46 is electrically connected to the data line 34. In addition, the switching drain electrode 50 is electrically connected to the driving gate electrode 38 through a contact hole 54, and the driving source electrode 48 is electrically connected to the power line 35 through a contact hole 56. Further, the driving drain electrode 52 is electrically connected to a first electrode 16 within the pixel region "P," wherein the power line 35 and a first capacitor electrode 15 that is formed of polycrystalline silicon layer form a storage capacitor "$C_{ST}$".

FIG. 3 is a cross sectional view along III—III of FIG. 2 according to the related art. In FIG. 3, a first insulating layer (i.e., a buffer layer) 14 is formed on a substrate 12, and a driving element, (i.e., a driving thin film transistor TFT) "$T_D$" including an active layer 42, a gate electrode 38, and source and drain electrodes 48 and 52 is formed on the first insulating layer 14. The active layer 42 is formed on the first insulating layer 14 and a second insulating layer (a gate insulating layer) 37 is interposed between the active layer 42 and the gate electrode 38. In addition, third and fourth insulating layers 39 and 41 are interposed between the gate electrode 38 and the source and drain electrodes 48 and 52. Further, a power line 35 is formed between the third and fourth insulating layers 39 and 41, and connected to the source electrode 48.

A first electrode 16 is formed over the driving TFT "$T_D$" and is connected to the drain electrode 52 of the driving TFT "$T_D$" with a fifth insulating layer 57 between the first electrode 16 and the driving TFT "$T_D$." An organic electroluminescent (EL) layer 18 is formed on the first electrode 16 for emitting light of a particular color wavelength, and a second electrode 20 is formed on the organic EL layer 18. Accordingly, after forming a sixth insulating layer 58 on the first electrode 16, the sixth insulating layer 58 is patterned to expose the first electrode 16. Then, the organic EL layer 18 and the second electrode 20 are sequentially formed on the exposed first electrode 16, and a storage capacitor "$C_{ST}$" is connected in parallel to the driving TFT "$T_D$," and includes first and second capacitor electrodes 15 and 35. The source electrode 48 contacts the second capacitor electrode 35 (i.e., a power line), and the first capacitor electrode 15 is formed of polycrystalline silicon material under the second capacitor electrode 35. Moreover, the second electrode 20 is formed on an entire surface of the substrate 12 on which the driving TFT "$T_D$," the storage capacitor "$C_{ST}$," and the organic electroluminescent layer 18 are formed.

In the OELD device, a TFT array part and an organic electroluminescent diode are formed over a first substrate, and an additional second substrate is attached with the first substrate for encapsulation. However, when the array part and the organic EL diode are formed on one substrate, a production yield of the organic ELD is determined by a multiplication of TFT's yield and organic emission layer's yield. Since the yield of the organic emission layer is relatively low, the production yield of an ELD is limited by the yield of the organic layer. For example, even when a TFT is properly fabricated, an OELD device using a thin film of about 1000 Å thickness can be determined to be unacceptable due to defects of the organic emission layer. Accordingly, the loss of materials causes an increase in production costs.

In general, OELD device are classified into bottom emission-type and top emission-type according to an emission direction of light used for displaying images. Bottom emission-type OELD devices have the advantages of high encapsulation stability and high process flexibility. However, the bottom emission-type OELD devices are ineffective for high resolution devices because they have poor aperture ratios. In contrast, the top emission-type OELD devices have a higher expected life span because they are easily designed and have a high aperture ratio. However, in the top emission-type OELD devices, the cathode is generally formed on an organic emission layer. As a result, transmittance and optical efficiency of the top emission-type OELD devices are reduced because of a limited number of materials that may be selected. If a thin film-type passivation layer is formed to prevent a reduction of the light transmittance, the thin film-type passivation layer may fail to prevent infiltration of exterior air into the device.

SUMMARY OF THE INVENTION

Accordingly, the present invention is directed to an OELD device and a method of fabricating an OELD that substantially obviate one or more of the problems due to limitations and disadvantages of the related art.

An object of the present invention is to provide a dual panel-type OELD device that is fabricated through forming array elements and organic electroluminescent diodes on respective substrates and attaching the respective substrates.

Another object of the present invention is to provide a method of fabricating a dual panel-type OELD device that is fabricated through forming array elements and organic electroluminescent diodes on respective substrates and attaching the respective substrates.

Another object of the present invention is to provide an OELD device having improved production yield, high brightness, and high aperture ratio.

Another object of the present invention is to provide a method of fabricating an OELD device having improved production yield, high brightness, and high aperture ratio.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent display device includes first and second substrates bonded together, the first and second substrates having a plurality of pixel regions, each pixel region includes a central portion and first and second portions at both sides of the central portion, a driving element on an inner surface of the first substrate within each of the plurality of pixel regions, the driving element being disposed in the central portion, first and second connection electrodes contacting the driving element and disposed in the first and second portions, a first electrode on an inner surface of the second substrate, an organic electroluminescent layer on the first electrode, and a second electrode on the organic electroluminescent layer, the second electrode contacting the first and second connection electrodes.

In another aspect, a method of fabricating an organic electroluminescent display device includes forming a driving element on a first substrate having a plurality of pixel regions, each pixel region including a central portion and first and second portions at both sides of the central portion, the driving element being disposed in the central portion, forming first and second connection electrodes contacting the driving element, the first and second connection electrodes being respectively disposed in the first and second portions, forming a first electrode on a second substrate, forming an organic electroluminescent layer on the first electrode, forming a second electrode on the organic electroluminescent layer, and bonding the first and second substrates together such that the second electrode contacts the first and second connection electrodes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention. In the drawings.

DETAILED DESCRIPTION OF THE EMBODIMENTS

Reference will now be made in detail to the preferred embodiments of the present invention, examples of which are illustrated in the accompanying drawings.

Figure 1:
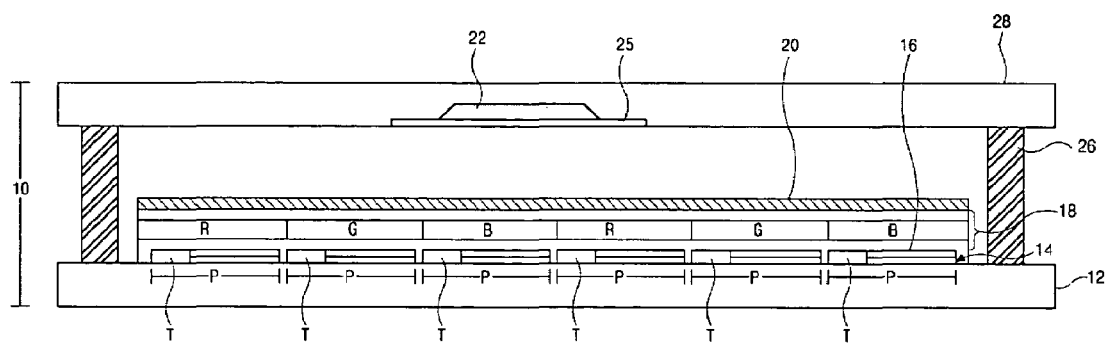
FIG. 1 is a cross sectional view of an OELD device according to the related art.
Figure 2:
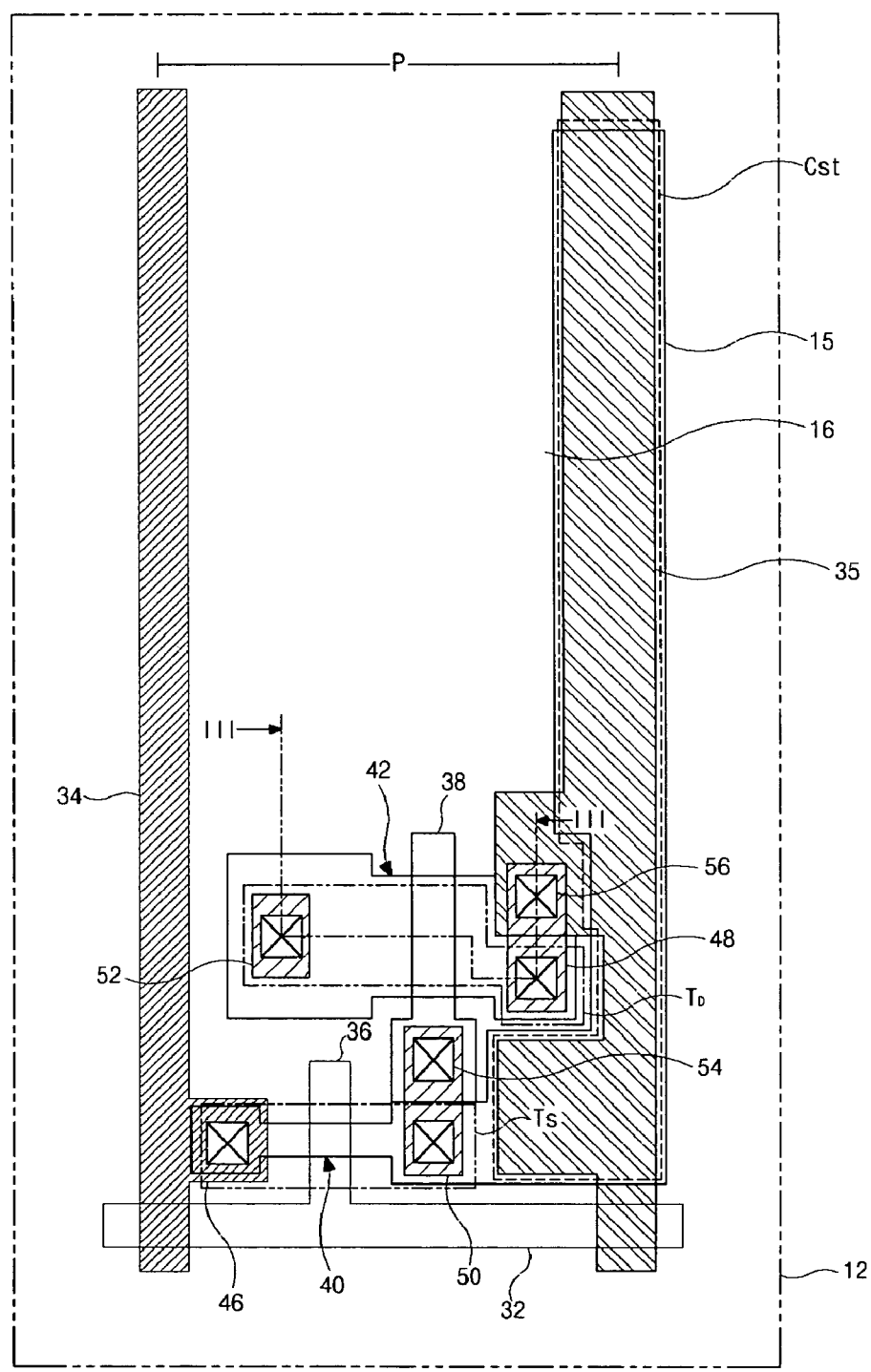
FIG. 2 is a plan view of a thin film transistor array part of an OELD device according to the related art.
Figure 3:
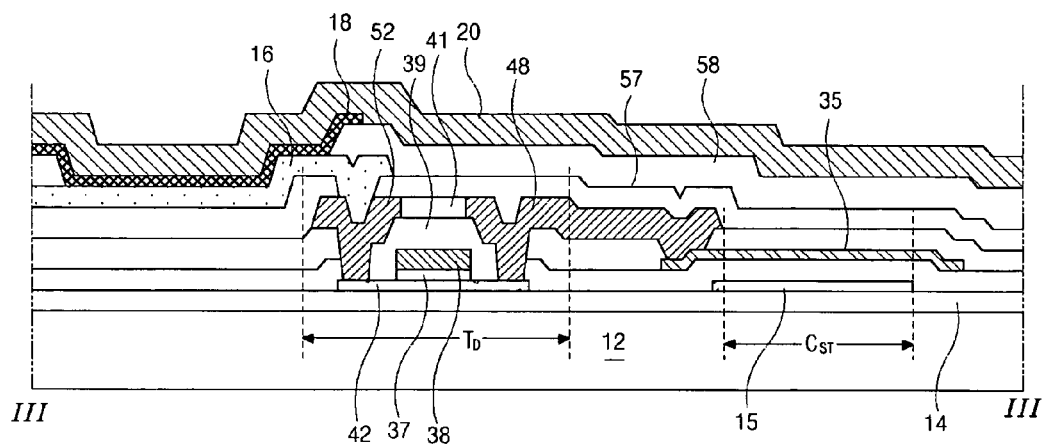
FIG. 3 is a cross sectional view along III—III of FIG. 2 according to the related art.
Figure 4:
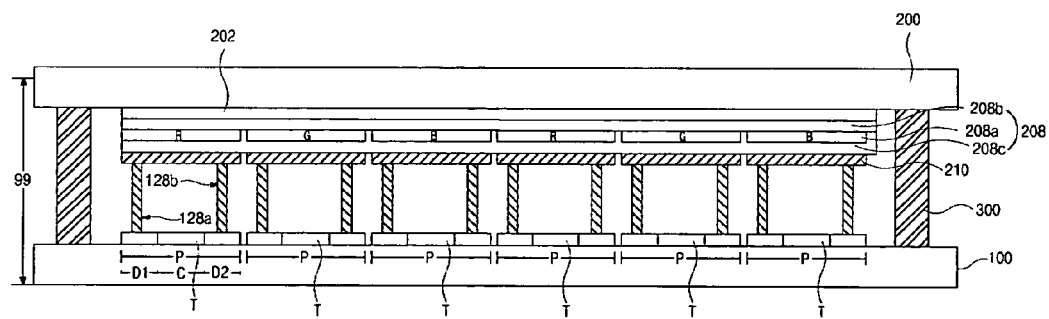
FIG. 4 is a schematic cross-sectional view of an exemplary OELD device according to the present invention.

FIG. 4 is a schematic cross-sectional view of an exemplary OELD device according to the present invention. In FIG. 4, an OELD device 99 may include first and second substrates 100 and 200 facing each other, and bonded together with a sealant 300. The first and second substrates 100 and 200 may include a plurality of pixel regions "P," switching and driving thin film transistors (TFTs) "T," and array lines (not shown) formed on an inner surface of the first substrate 100 within each of the pixel regions "P." Although not shown, the array lines may include a gate line, a data line, a power line, and a common line.

In FIG. 4, a first electrode 202 may be formed on an inner surface of the second substrate 200, and an organic electroluminescent (EL) layer 208 emitting one of red, green, and blue colored lights may be formed on the first electrode 202 within each of the pixel regions "P." In addition, a second electrode 210 may be formed on the organic EL layer 208 within each of the pixel regions "P." The organic EL layer 208 may include a single layer structure or may include a multiple layer structure. The multiple layer structure may include the organic EL layer 208 having a hole-transporting layer 208b on the first electrode 202, an emission layer 208a on the hole-transporting layer 208b, and an electron-transporting layer 208c on the emission layer 208a.

The pixel regions "P" may each include a central portion "C" and first and second portions "D1" and "D2" surrounding the central portion "C," wherein the driving TFT "T" may be formed in the central portion "C." In addition, first and second connection electrodes 128a and 128b may be formed in the first and second portions "D1" and "D2," respectively, wherein the first and second connection electrodes 128a and 128b may be connected to the second electrode 210. The first and second connection electrodes 128a and 128b may be formed on the driving TFT "T" during a fabricating process of the first substrate 100, or the first and second connection electrodes 128a and 128b may be formed on the second electrode 210 during a fabricating process of the second substrate 200. After bonding the first and second substrates 100 and 200 together, the driving TFT "T" and the second electrode 210 may be connected to each other through the first and second connection electrodes 128a and 128b.

Figure 5:
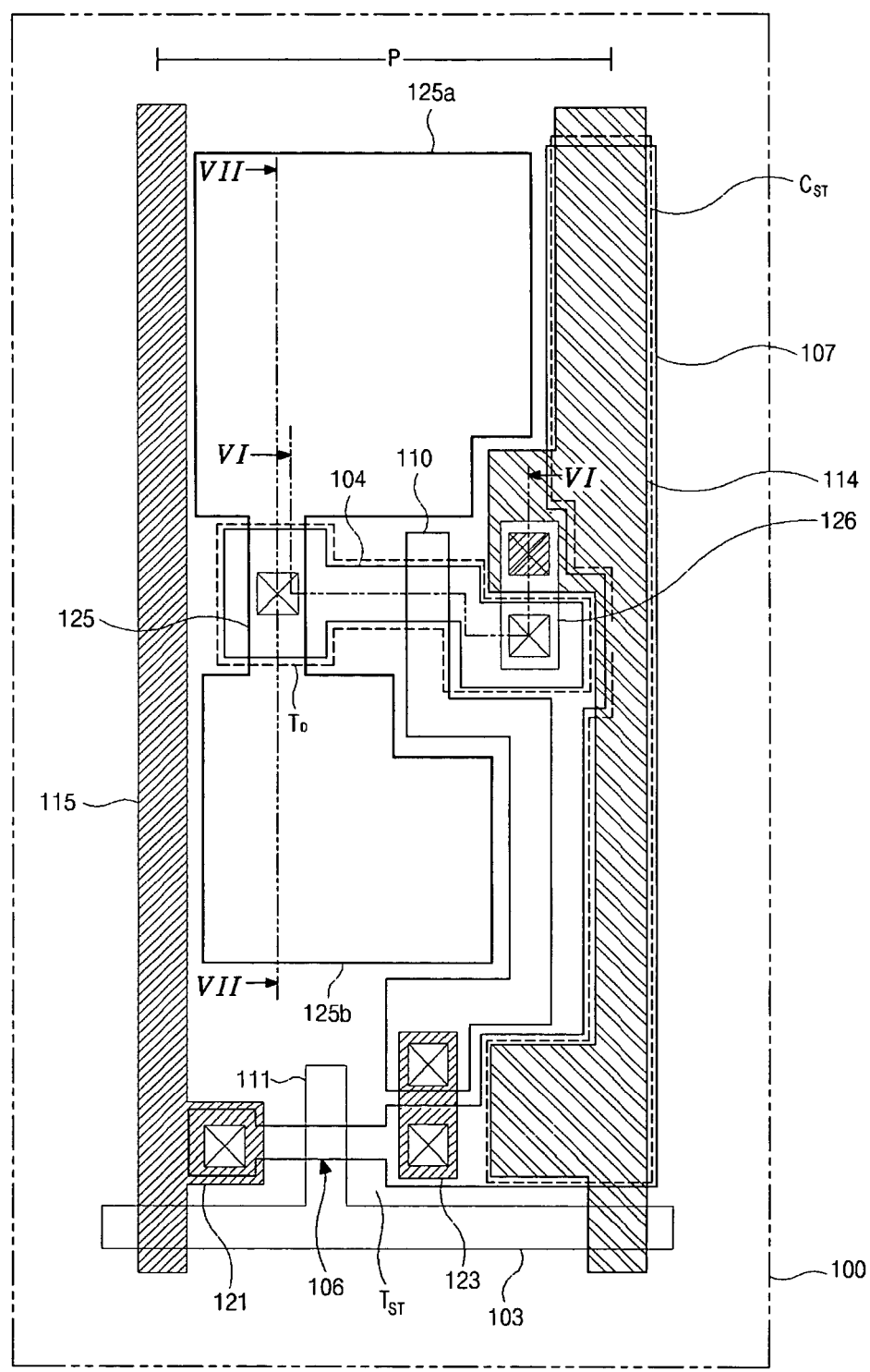
FIG. 5 is a schematic plan view of an exemplary thin film transistor array part of an OELD device according to the present invention.

FIG. 5 is a schematic plan view of an exemplary thin film transistor array part of an OELD device according to the present invention. In FIG. 5, a gate line 103, a data line 115, and a power line 114 may be formed on a first substrate 100, wherein the data line 115 and the power line 114 may cross the gate line 103 to define a pixel region "P." A driving thin film transistor (TFT) "$T_D$," a switching thin film transistor (TFT) "$T_{ST}$," and a storage capacitor "$C_{ST}$" may be formed within the pixel region "P." The driving TFT "$T_D$" may include a driving active layer 104, a driving gate electrode 110, and driving source and drain electrodes 126 and 125, and the switching TFT "$T_{ST}$" may include a switching active layer 106, a switching gate electrode 111, and switching source and drain electrodes 121 and 123. The storage capacitor "$C_{ST}$" may be connected in parallel to the driving TFT "$T_D$," and may use an active pattern 107 of polycrystalline silicon as a first capacitor electrode and the power line 114 as a second capacitor electrode. The switching source electrode 121 may be connected to the data line 115, and the switching drain electrode 123 may be connected to the driving gate electrode 110.

The driving TFT "$T_D$" may be formed at a central portion of the pixel region "P." Accordingly, the driving gate electrode 110 may extend to the switching TFT "$T_{ST}$" and may contact the switching drain electrode 123. The driving drain electrode 125 may include first and second extensions 125a and 125b, and the pixel region "P" may be divided into first and second portions with the central portion having the driving TFT "$T_D$" as a center. The first and second extensions 125a and 125b may be formed in the first and second portions, respectively. Although not shown, the first and second extensions 125a and 125b may contact the first and second connection electrodes 128a and 128b (in FIG. 4), respectively.

FIGS. 6A to 6D and are schematic cross sectional views along VI—VI of FIG. 5 of an exemplary method of fabricating a thin film transistor array part of an organic electroluminescent device according to the present invention, and FIGS. 7A to 7D are schematic cross sectional views along VII—VII of FIG. 5 of another exemplary method of fabricating a thin film transistor array part of an organic electroluminescent device according to the present invention.

Figure 6A:
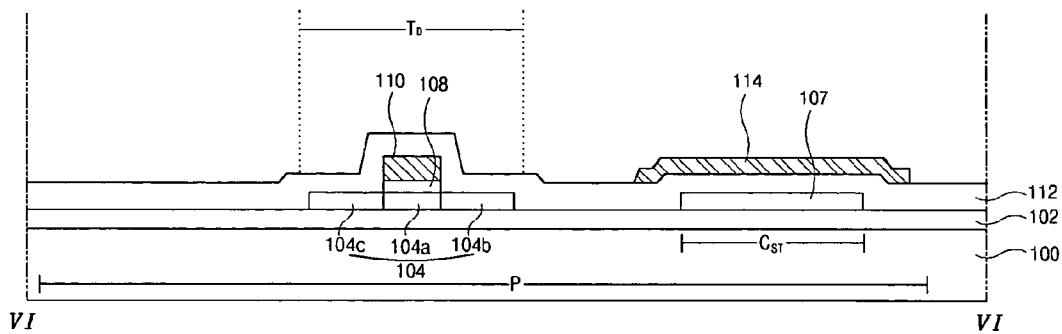
FIGS. 6A to 6D are schematic cross sectional views along VI—VI of FIG. 5 of an exemplary method of fabricating a thin film transistor array part of an organic electroluminescent device according to the present invention.
Figure 7A:
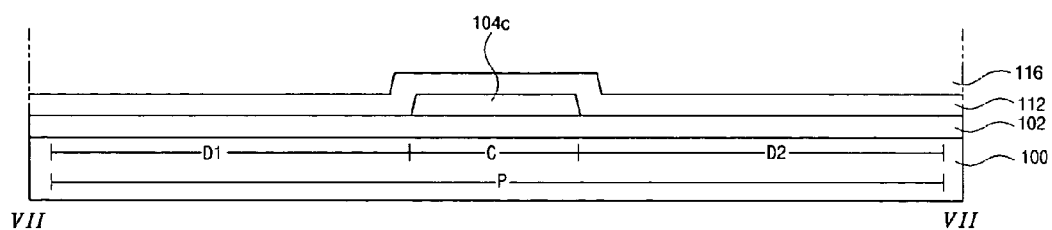
FIGS. 7A to 7D are schematic cross sectional views along VII—VII of FIG. 5 of another exemplary method of fabricating a thin film transistor array part of an organic electroluminescent device according to the present invention.

In FIGS. 6A and 7A, a first insulating layer (i.e., a buffer layer) 102 may be formed on a first substrate 100 having a pixel region "P" by depositing one of inorganic insulating material(s), such as silicon nitride ($SiN_x$) and silicon oxide ($SiO_2$). The pixel region "P" may be divided into a central portion "C," and first and second portions "D1" and "D2" at both sides of the central portion "C," wherein a driving thin film transistor "$T_D$" and a storage capacitor "$C_{ST}$" may be disposed in the central portion "C."

Then, an amorphous silicon (a-Si:H) layer (not shown) may be formed on the first insulating layer 102, and crystallized to form a polycrystalline silicon layer (not shown). Next, a driving active layer 104 including a channel region 104a, and source and drain regions 104b and 104c at both sides of the channel region 104a may be formed by patterning the polycrystalline silicon layer. At the same time, an active pattern 107 used as a first capacitor electrode may be formed on the first insulating layer 102. Alternatively, a dehydrogenation process may be performed before the crystallization process, and the crystallization process can be performed by using heat or light.

Next, a second insulating layer (i.e., a gate insulating layer) 108 may be formed on the driving active layer 104 by depositing inorganic insulating material(s), such as silicon nitride ($SiN_x$) and silicon oxide ($SiO_2$). The second insulating layer 108 may be formed on an entire surface of the first substrate 100 without any subsequent etch process, or may be etched to have the same shape as a driving gate electrode 110 after forming the driving gate electrode 110.

Next, a driving gate electrode 110 may be formed on the second insulating layer 108 over the channel region 104a, and as shown in FIG. 5, the driving gate electrode 110 may extend to a switching TFT "$T_{ST}$." Then, the source and drain regions 104b and 104c of the active layer 104 may be doped with impurities, such as boron (B) or phosphorous (P). The driving gate electrode 110 may include conductive metallic material(s), such as aluminum (Al), an aluminum (Al) alloy, copper (Cu), tungsten (W), tantalum (Ta), and molybdenum (Mo).

Next, a third insulating layer (i.e., an interlayer insulating layer) 112 may be formed on the driving gate electrode 110, and a power line 114 may be formed on the third insulating layer 112. The power line 114 may supply signals to a driving drain electrode (not shown) and may be used as a second capacitor electrode.

Figure 6B:
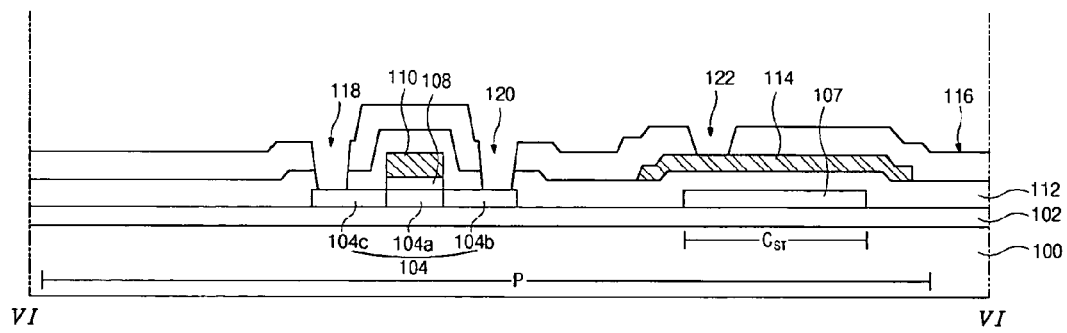
Figure 7B:
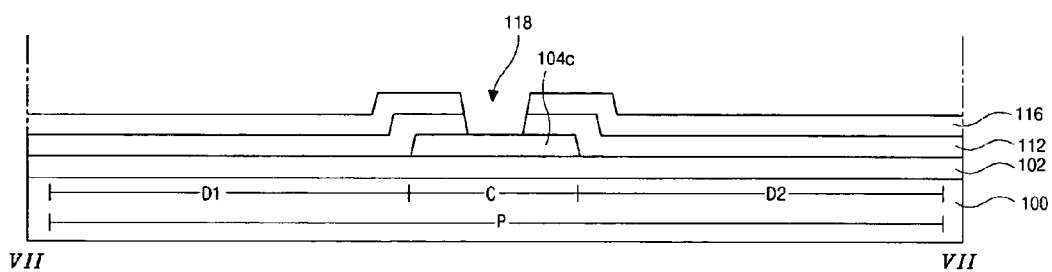

In FIGS. 6B and 7B, a fourth insulating layer (i.e., a passivation layer) 116 may be formed on the power line 114 by depositing inorganic insulating material(s), such as silicon nitride ($SiN_x$) and silicon oxide ($SiO_2$), or organic insulating material(s), such as benzocyclobutene (BCB) and acrylic resin. The fourth insulating layer 116 may include first, second, and third contact holes 120, 118, and 122 to expose the source region 104b, the drain region 104c, and the power line 114, respectively. Although not shown, a switching active layer may be simultaneously exposed.

Figure 6C:
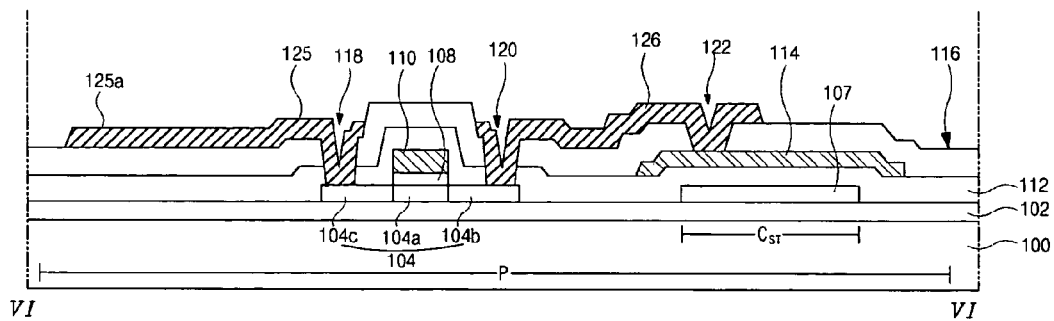
Figure 7C:
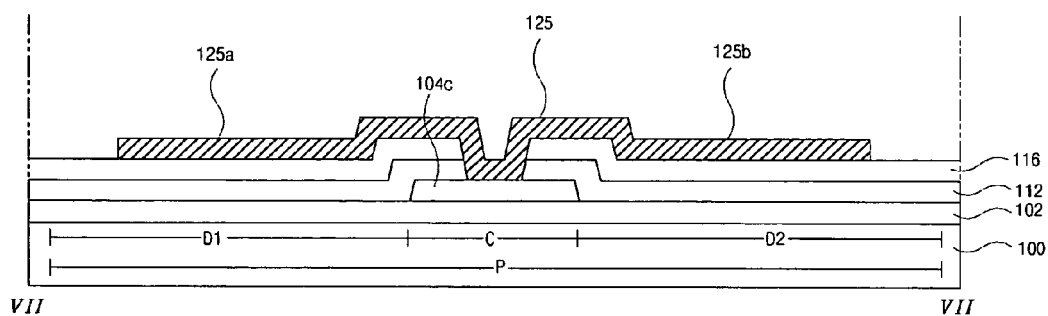

In FIGS. 6C and 7C, driving source and drain electrode 126 and 125 may be formed on the fourth insulating layer 116 by depositing and patterning conductive metallic material(s), such as aluminum (Al), an aluminum (Al) alloy, chromium (Cr), tungsten (W), and molybdenum (Mo). The driving drain electrode 125 may be connected to the drain region 104c through the first contact hole 118 and may extend to the first and second portions "D1" and "D2." The source electrode 126 may be connected to the source region 104b through the second contact hole 120 and may be connected to the power line 114 through the third contact hole 122. Although not shown, switching source and drain electrodes and a data line 115 (in FIG. 5) may be simultaneously formed over the switching active layer. The switching source electrode may be connected to the data line 115 (in FIG. 5) parallel to the power line 114, and the switching drain electrode may be connected to the driving gate electrode 110. In addition, the driving drain electrode 125 may include first and second extensions 125a and 125b disposed in the first and second portions "D1" and "D2" of the pixel regions "P," respectively, wherein the first and second extensions 125a and 125b may be formed to have various shapes.

Figure 6D:
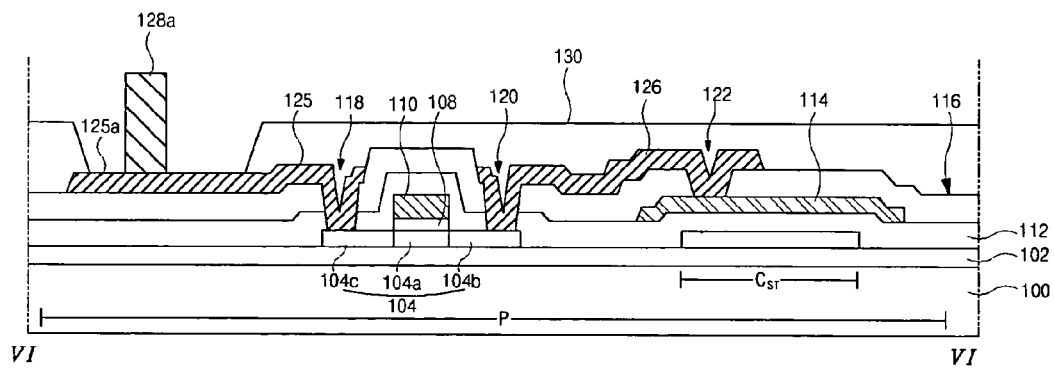
Figure 7D:
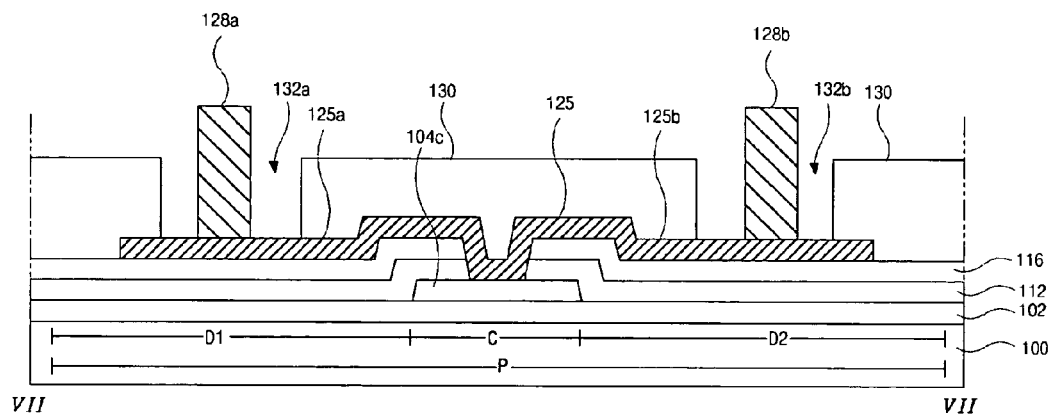

In FIGS. 6D and 7D, a fifth insulating layer 130 having first and second open portions 132a and 132b may be formed on the driving source and drain electrodes 126 and 125 by depositing organic insulating material(s), such as benzocyclobutene (BCB) and acrylic resin. The first and second open portions 132a and 132b may expose the first and second extensions 125a and 125b of the driving drain electrode 125, respectively. In addition, first and second connection electrodes 128a and 128b may be formed on the first and second extensions 125a and 125b, respectively, wherein the first and second connection electrodes 128a and 128b may contact a second electrode 210 (in FIG. 4) after bonding the first and second substrates 100 and 200 (in FIG. 4) together. Accordingly, the first and second connection electrodes 128a and 128b may include the same material as the second electrode 210 (in FIG. 4). Alternatively, the fifth insulating layer 130 may be omitted.

In the present invention, a driving TFT may be disposed in a central portion of a pixel region. In addition, first and second connection electrodes may be disposed in first and second portions at both sides of the central portion, respectively. Accordingly, a connection portion between a second electrode and a driving drain electrode may be enlarged. Moreover, since the connection portion may include two parts (first and second connection electrodes), connection inferiority due to a substrate warpage may be prevented.

Figure 8A:
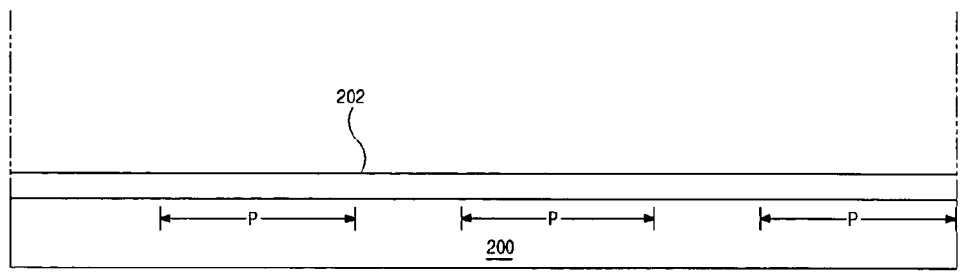
FIGS. 8A to 8C are schematic cross sectional views of another exemplary method of fabricating an organic electroluminescent diode of an organic electroluminescent device according to the present invention.
Figure 8B:
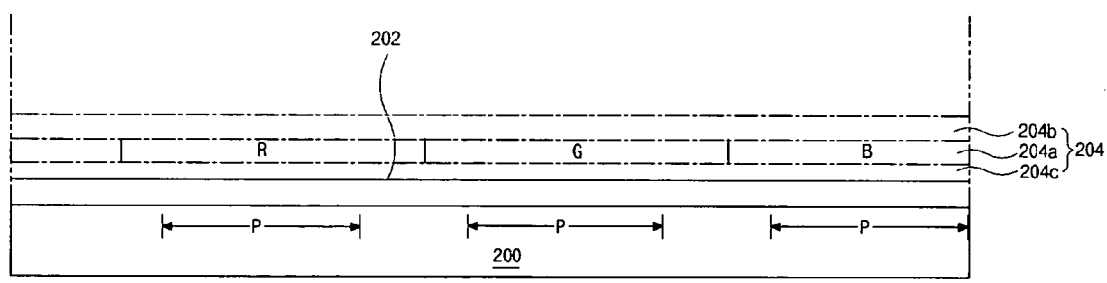
Figure 8C:
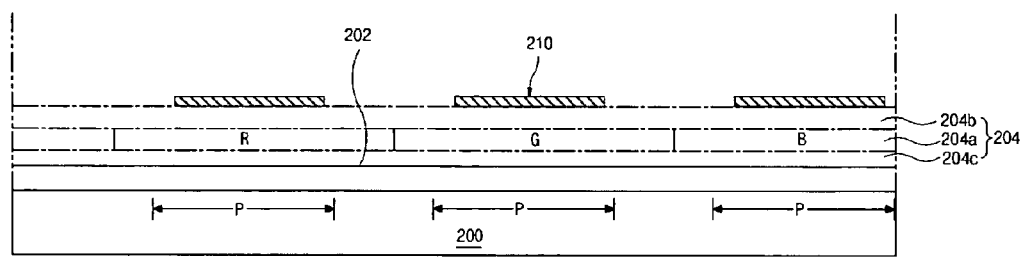

FIGS. 8A to 8C are schematic cross sectional views of another exemplary method of fabricating an organic electroluminescent diode of an organic electroluminescent device according to the present invention. In FIG. 8A, a first electrode 202 may be formed on a second substrate 200 having a plurality of pixel regions "P." The first electrode 202 may include transparent conductive metallic material(s), such as indium-tin-oxide (ITO) and indium-zinc-oxide (IZO).

In FIG. 8B, an organic electroluminescent (EL) layer 204 emitting one of red (R), green (G), and blue (B) colored lights may be formed on the first electrode 202 within each of the pixel regions "P." The organic EL layer 204 may have a single layer structure or a multiple layer structure. In the multiple layer structure, the organic EL layer 204 may having a hole-transporting layer 204b on the first electrode 202, an emission layer 204a on the hole-transporting layer 204b, and an electron-transporting layer 204c on the emission layer 204a.

In FIG. 8C, a second electrode 210 may be formed on the organic EL layer 204 within each of the pixel regions "P." The second electrode 210 may include a single layer structure including at least one of aluminum (Al), calcium (Ca), and magnesium (Mg), for example, or may have a multiple layer structure including lithium fluorine/aluminum (LiF/Al), for example.

Next, an OELD device may be obtained by bonding the first and second substrates 100 and 200 fabricated through processes of FIGS. 6A to 8C together.

An OELD device according to the present invention is advantageous since a connection portion may include two parts (first and second connection electrodes) disposed in first and second portions at both sides of a central portion of a pixel region. Accordingly, the connection portion may be enlarged and a connection inferiority due to a substrate warpage may be prevented, thereby obtaining a highly reliable device.

In addition, since the OELD device is a top emission-type OELD device, a thin film transistor may be easily designed, and high resolution and high aperture ratio may be obtained regardless of lower array patterns. Furthermore, since array patterns and an organic EL diode may be formed on respective substrates, production yield and production management efficiency are improved, and a lifetime of an organic EL device is lengthened.

It will be apparent to those skilled in the art that various modifications and variations can be made in the organic electroluminescent device and fabricating method thereof of the present invention without departing from the spirit or scope of the invention. Thus, it is intended that the present invention cover the modifications and variations of this invention provided they come within the scope of the appended claims and their equivalents.

What is claimed is:

1. An organic electroluminescent display device, comprising:
   first and second substrates bonded together, the first and second substrates having a plurality of pixel regions, each pixel region includes a central portion and first and second portions at both sides of the central portion;
   a driving element on an inner surface of the first substrate within each of the plurality of pixel regions, the driving element being disposed in the central portion;
   first and second connection electrodes contacting the driving element and disposed in the first and second portions;

a first electrode on an inner surface of the second substrate;

an organic electroluminescent layer on the first electrode; and a second electrode on the organic electroluminescent layer, wherein the second electrode contacts the first and second connection electrodes.

2. The device according to claim 1, wherein the driving element includes a thin film transistor having a driving active layer, a driving gate electrode, a driving source electrode, and a driving drain electrode.

3. The device according to claim 2, wherein the driving drain electrode includes a first extension in the first portion and a second extension in the second portion.

4. The device according to claim 3, wherein the first and second connection electrodes contact the first and second extensions, respectively.

5. The device according to claim 1, further comprising a switching element connected to the driving element via a capacitor.

6. The device according to claim 5, wherein the switching element includes a gate electrode connected to a gate line, a source connected to a data line, and a drain connected to a first electrode of the capacitor.

7. The device according to claim 6, wherein the driving element includes a source connected to a second electrode of the capacitor.

8. The device according to claim 6, wherein the drain of the switching element is connected to a gate of the driving element.

9. The device according to claim 1, wherein the first electrode is an anode for injecting holes into the organic electroluminescent layer and the second electrode is a cathode for injecting electrons into the organic electroluminescent layer.

10. The device according to claim 9, wherein the first electrode includes one of indium-tin-oxide (ITO) and indium-zinc-oxide (IZO).

11. The device according to claim 9, wherein the second electrode includes at least one of aluminum (Al), calcium (Ca), magnesium (Mg), and lithium (Li).

12. The device according to claim 1, wherein the organic electroluminescent layer includes a hole-transporting layer and an electron-transporting layer.

13. A method of fabricating an organic electroluminescent display device, comprising:

forming a driving element on a first substrate having a plurality of pixel regions, each pixel region including a central portion and first and second portions at both sides of the central portion, the driving element being disposed in the central portion;

forming first and second connection electrodes contacting the driving element, the first and second connection electrodes being respectively disposed in the first and second portions;

forming a first electrode on a second substrate;

forming an organic electroluminescent layer on the first electrode;

forming a second electrode on the organic electroluminescent layer; and bonding the first and second substrates together such that the second electrode contacts the first and second connection electrodes.

14. The method according to claim 13, wherein forming of the driving element includes forming a driving active layer, forming a driving gate electrode, and forming driving source and drain electrodes.

15. The method according to claim 14, wherein the driving drain electrode includes a first extension in the first portion and a second extension in the second portion.

16. The method according to claim 15, wherein the first and second connection electrodes contact the first and second extensions, respectively.

17. The method according to claim 13, further comprising forming a switching element connected to the driving element.

18. The method according to claim 13, wherein the first electrode is an anode for injecting holes into the organic electroluminescent layer and the second electrode is a cathode for injecting electrons into the organic electroluminescent layer.

19. The method according to claim 18, wherein the first electrode includes one of indium-tin-oxide (ITO) and indium-zinc-oxide (IZO).

20. The device according to claim 18, wherein the second electrode includes at least one of aluminum (Al), calcium (Ca), magnesium (Mg), and lithium (Li).

21. The method according to claim 13, wherein the organic electroluminescent layer includes a hole-transporting layer and an electron-transporting layer.

* * * * *